(12) United States Patent
Huang

(10) Patent No.: US 12,087,776 B2
(45) Date of Patent: Sep. 10, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventor: Yu-Lien Huang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 297 days.

(21) Appl. No.: 17/586,089

(22) Filed: Jan. 27, 2022

(65) Prior Publication Data

US 2023/0238382 A1 Jul. 27, 2023

(51) Int. Cl.
| | |
|---|---|
| H01L 27/092 | (2006.01) |
| H01L 21/8238 | (2006.01) |
| H01L 29/66 | (2006.01) |
| H01L 29/78 | (2006.01) |

(52) U.S. Cl.
CPC .. H01L 27/0924 (2013.01); H01L 21/823814 (2013.01); H01L 21/823821 (2013.01); H01L 29/66795 (2013.01); H01L 29/7851 (2013.01)

(58) Field of Classification Search
CPC ......... H01L 27/0924; H01L 21/823814; H01L 21/823821; H01L 29/66795; H01L 29/7851; H01L 21/76831; H01L 21/76897; H01L 29/41791; H01L 29/785
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 9,911,736 B1* | 3/2018 | Zang ................. H01L 21/31053 |
| 2018/0138092 A1* | 5/2018 | Lee ................. H01L 21/823437 |

* cited by examiner

Primary Examiner — Karen Kusumakar
Assistant Examiner — Adam S Bowen
(74) Attorney, Agent, or Firm — Maschoff Brennan

(57) ABSTRACT

The method for forming a semiconductor device includes forming gate spacers on a substrate; forming a gate structure on the substrate and laterally between the gate spacers; forming a protective cap over the gate structure and laterally between the gate spacers; forming source/drain structures over the substrate and on opposite sides of the gate structure; depositing a dielectric layer over the protective cap, the gate spacers, and the source/drain structures; performing an etching process on the dielectric layer to form an opening exposing one of the source/drain structures, the etching process further etching a first one of the gate spacers to expose the protective cap; selectively depositing a capping material on the exposed protective cap; forming a source/drain contact in the opening.

20 Claims, 19 Drawing Sheets

SEMICONDUCTOR DEVICE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
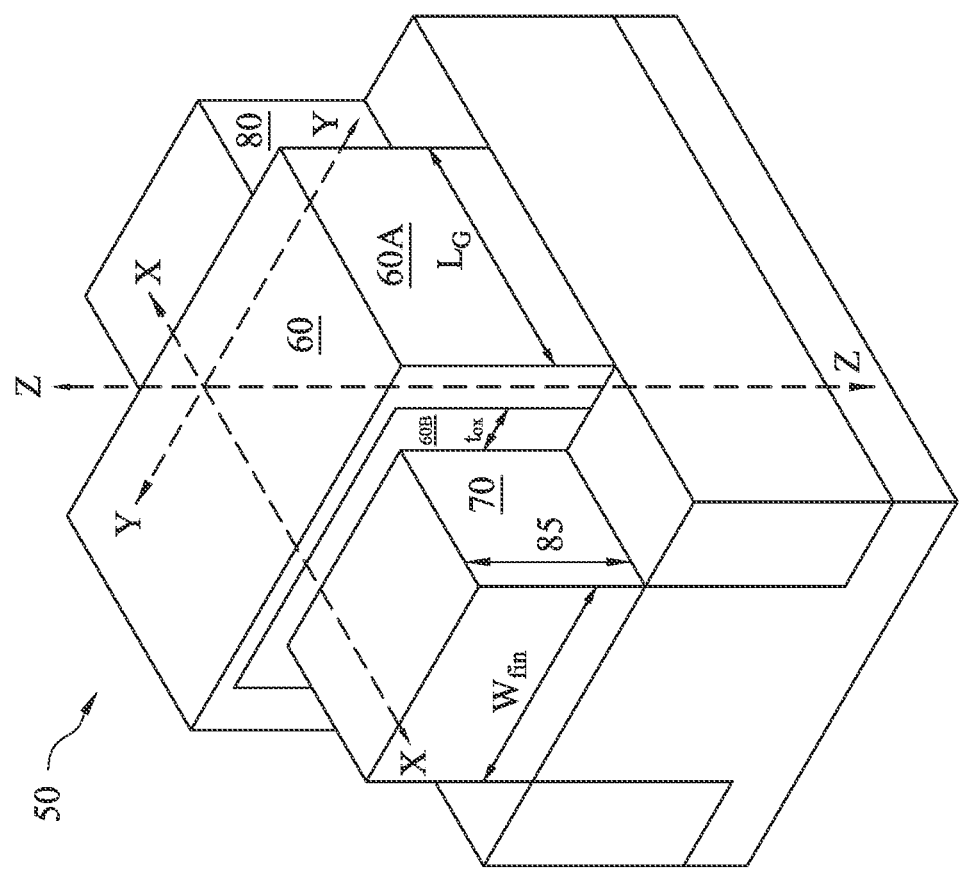
FIG. 1A is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

The fins may be patterned by any suitable method. For example, the fins may be patterned using one or more photolithography processes, including double-patterning or multi-patterning processes. The double-patterning or the multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In order to define self-aligned gate contact region over a gate structure, a protective cap may be formed on the gate structure. However, the etching process for forming a source/drain contact opening in a subsequent process may consume the protective cap, and thus the protective cap may be damaged to a thinner thickness, and thus may not be thick enough to suppress a leakage current. That is, if the source/drain contact formed subsequently in the opening directly lands on the thinner protective cap, a leakage current may occur to flow between the source/drain contact and the gate structure through the thinner protective cap, which in turn reduces the yield of the semiconductor device.

Therefore, the present disclosure in various embodiments provides a selective deposition process for forming a cap material over the thinned protective cap that is exposed in the source/drain contact opening. An advantage is that the cap material on the thinned protective cap may be formed to increase a distance between the gate structure and the source/drain contact formed in the source/drain contact opening, which in turn prevents a leakage current from flowing between the gate structure and the source/drain contact, and thus the yield of the semiconductor device can be improved.

FIG. 1A is a perspective view of an example FinFET device. The use of FinFET devices has been gaining popularity in the semiconductor industry. Referring to FIG. 1A, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 1B:
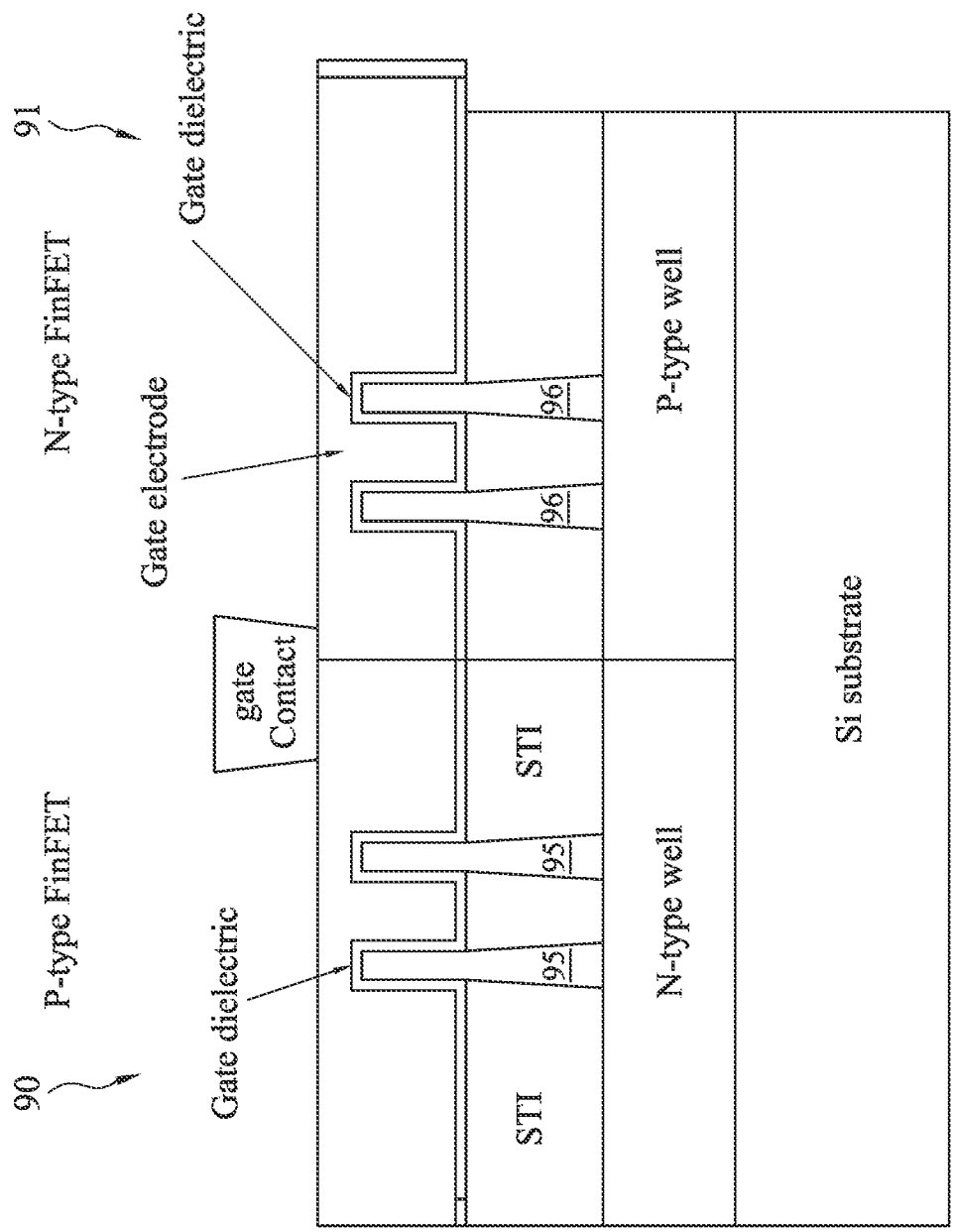
FIG. 1B is a diagrammatic cross-sectional side view of FinFET transistors in a CMOS configuration.

FIG. 1B illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91. In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

Figure 2A:
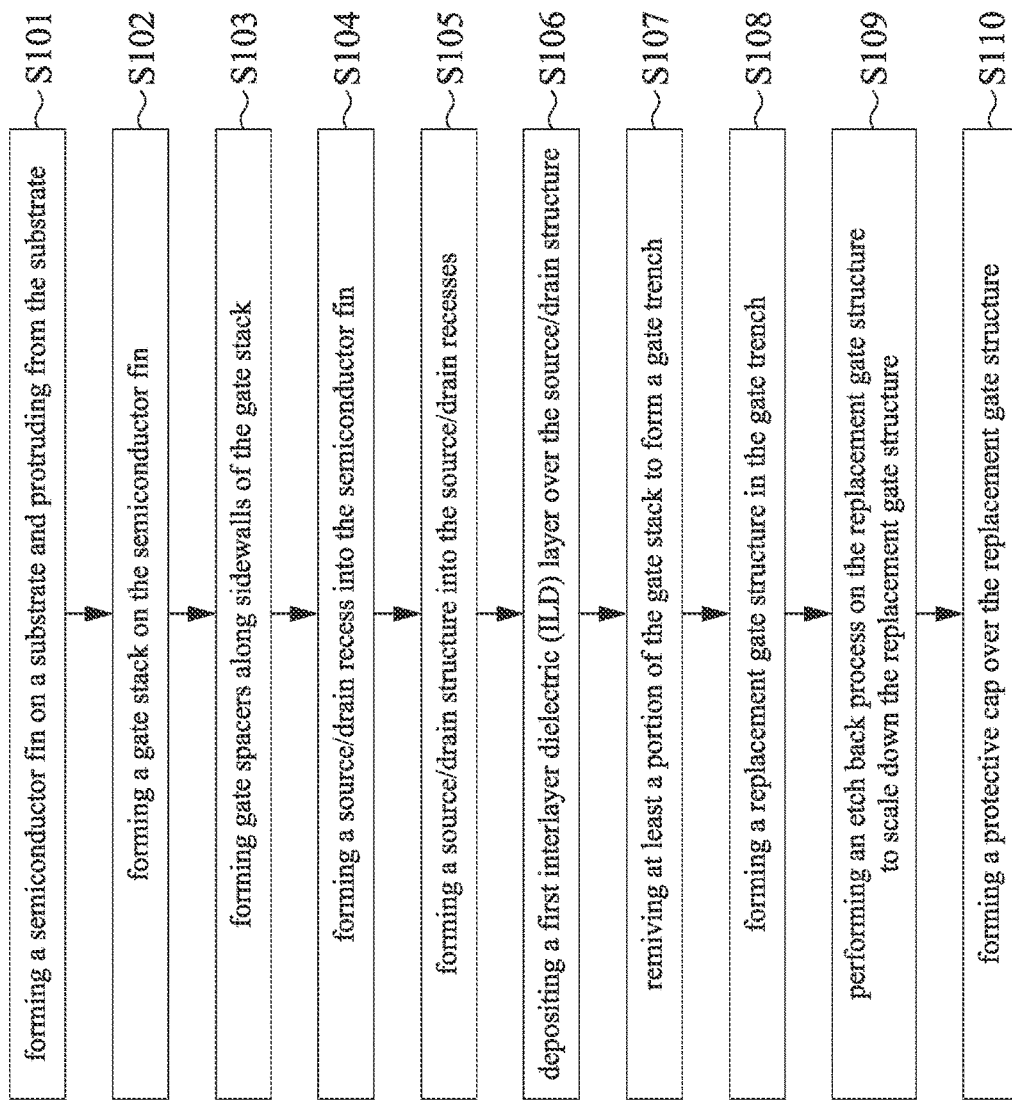
FIGS. 2A and 2B are a flowchart of a method for forming a semiconductor device in accordance with some embodiments of the present disclosure.
Figure 2B:
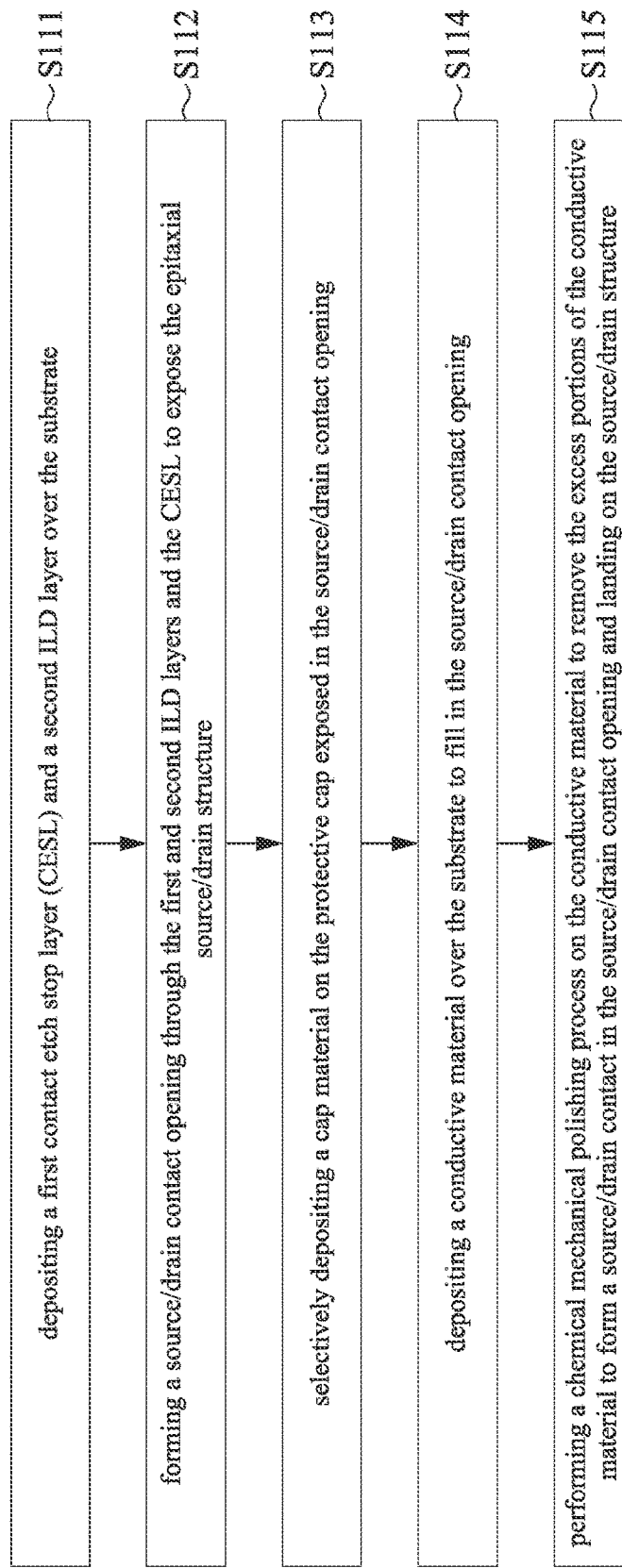

Referring now to FIGS. 2A and 2B, illustrated is a flowchart of an exemplary method M for fabrication of a semiconductor device 100 in accordance with some embodiments. The method M includes a relevant part of the entire manufacturing process. It is understood that additional operations may be provided before, during, and after the operations shown by FIGS. 2A and 2B, and some of the operations described below can be replaced or eliminated for additional embodiments of the method. The order of the operations/processes may be interchangeable. The method M includes fabrication of a semiconductor device 100. However, the fabrication of the semiconductor device 100 is merely an example for describing the manufacturing process according to some embodiments of the present disclosure.

Figure 3:
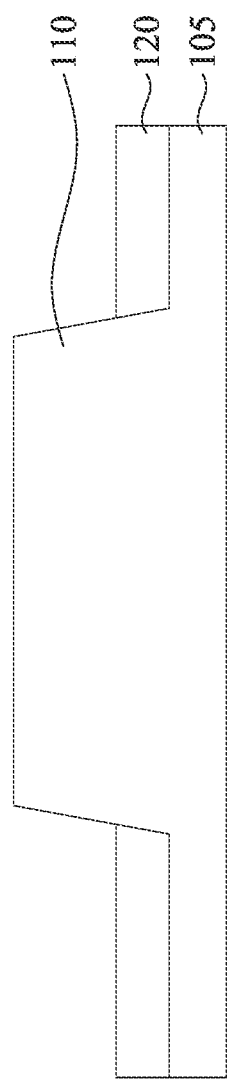
FIGS. 3 to 17 illustrate a method in various stages of forming a semiconductor device in accordance with some embodiments of the present disclosure.

FIGS. 3-17 illustrate the method M in various stages of forming a semiconductor device 100 in accordance with some embodiments of the present disclosure. The method M begins at block S101. Referring to FIG. 3, in some embodiments of block S101, a semiconductor fin is formed on a substrate and protrudes from the substrate. In some embodiments, the substrate 105 includes silicon. Alternatively, the substrate 105 may include germanium, silicon germanium, gallium arsenide or other appropriate semiconductor materials. Also alternatively, the substrate 105 may include an epitaxial layer. For example, the substrate 105 may have an epitaxial layer overlying a bulk semiconductor. Further, the substrate 105 may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such a strained substrate may be formed by selective epitaxial growth (SEG). Furthermore, the substrate 105 may include a semiconductor-on-insulator (SOI) structure. Also alternatively, the substrate 105 may include a buried dielectric layer, such as a buried oxide (BOX) layer, such as that formed by separation by implantation of oxygen (SIMOX) technology, wafer bonding, SEG, or another appropriate method.

In some embodiments, the semiconductor fin 110 includes silicon. The semiconductor fin 110 may be formed, for example, by patterning and etching the substrate 105 using photolithography techniques. In some embodiments, a layer of photoresist material (not shown) is sequentially deposited over the substrate 105. The layer of photoresist material is irradiated (exposed) in accordance with a desired pattern (the semiconductor fin 110 in this case) and developed to remove portions of the photoresist material. The remaining photoresist material protects the underlying material from subsequent processing steps, such as etching. It is noted that other masks, such as an oxide or silicon nitride mask, may also be used in the etching process.

An isolation dielectric 120 is formed to fill trenches between the semiconductor fins 110 to serve as shallow trench isolation (STI). The isolation dielectric 120 may include any suitable dielectric material, such as silicon oxide. The method of forming the isolation dielectric 120 may include depositing an isolation dielectric 120 on the substrate 105 to cover the semiconductor fin 110, optionally performing a planarization process, such as a chemical mechanical polishing (CMP) process, to remove the excess isolation dielectric 120 outside the trenches, and then performing an etching process on the isolation dielectric 120 until upper portions of the semiconductor fins 110 are exposed. In some embodiments, the etching process performed may be a wet etching process, such as that in which the substrate 105 is dipped in hydrofluoric acid (HF). In alternative embodiments, the etching process may be a dry etching process. For example, the dry etching process may be performed using $HF/NH_3$ or $NF_3/NH_3$ as the etching gas.

Figure 4:
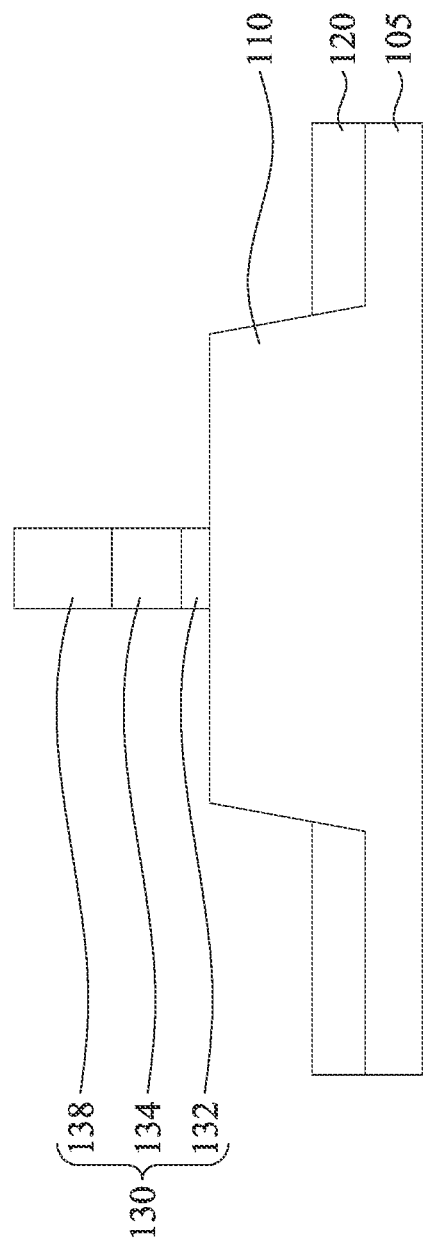

Referring back to FIG. 2A, the method M then proceeds to block S102 where a gate stack is formed on the semiconductor fin. With reference to FIG. 4, in some embodiments of block S102, gate stacks 130 are formed on portions of the semiconductor fin 110, such that other portions of the semiconductor fin 110 are exposed. In some embodiments using a gate-last process, the gate stacks 130 are dummy gates and at least portions thereof will be replaced by final gate stack at a subsequent stage. For example, portions of the gate stacks 130 may be replaced at a subsequent stage by metal gate electrode (MG) after high temperature thermal processes, such as thermal annealing for source/drain activation during the formation of sources/drains.

In some embodiments, each of the gate stacks 130 may include a gate dielectric 132, a dummy electrode 134, and a gate mask 138. In some embodiments, the gate dielectric 132 includes silicon oxide. In alternative embodiments, the gate dielectric 132 may have a multilayer structure such as one layer of silicon oxide (e.g., interfacial layer) and another layer of high-k material. The dummy electrode 134 may include polycrystalline silicon (polysilicon), as an example. The gate masks 138 may include a suitable dielectric material, such as silicon nitride, silicon oxynitride or silicon carbide, as examples. In some embodiments, the gate mask 138 may have a material different than the dummy electrode 134. The gate stacks 130 can be formed by deposition and patterning. For example, the gate dielectric 132 is blanket deposited on the structure shown in FIG. 3 by a suitable technique, such as chemical vapor deposition (CVD). The dummy electrode 134 is deposited on the gate dielectric 132 by a suitable technique, such as CVD. The gate mask 138 is deposited on the dummy electrode 134 by a suitable technique, such as CVD. Next, the gate mask 138 is patterned by a lithography process and an etching process, thereby forming openings in the gate mask 138, and exposing the underlying protective cap materials within the openings. The lithography process may include photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). Another etching process is applied to the protective cap materials and dummy gate materials through the openings of the gate mask 138 using the gate mask 138 as an etch mask, thereby forming the gate stacks 130 straddling portions of the semiconductor fin 110.

Figure 5:
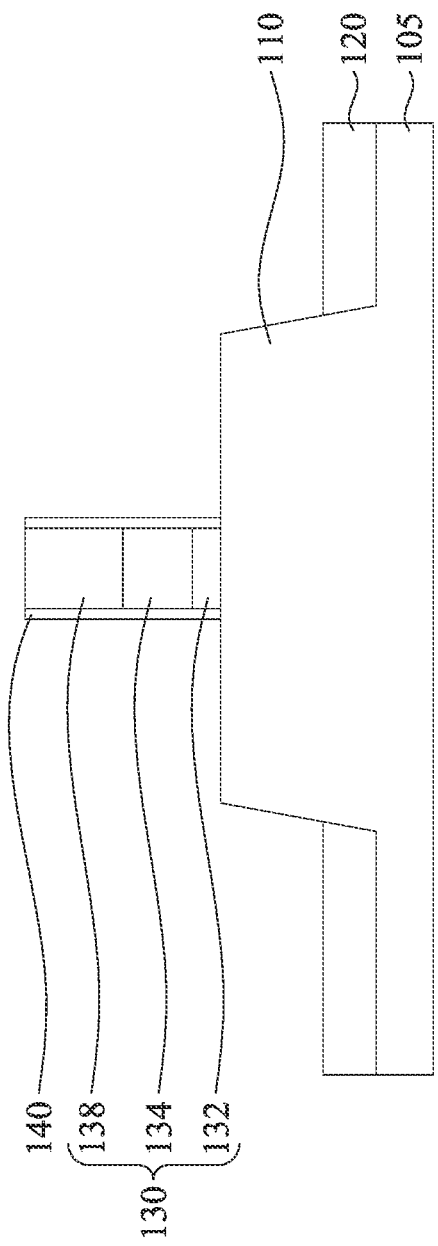

Referring back to FIG. 2A, the method M then proceeds to block S103 where gate spacers are formed along sidewalls of the gate stack. With reference to FIG. 5, in some embodiments of block S103, gate spacers 140 are formed along sidewalls of the gate stacks 130. In some embodiments, the gate spacers 140 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials. The gate spacers 140 may include a single layer or multilayer structure made of different dielectric materials. The method of forming the gate spacers 140 include blanket forming a dielectric layer on the structure shown in FIG. 4 using, for example, CVD, PVD or ALD, and then performing an etching process such as anisotropic etching to remove horizontal portions of the dielectric layer. The remaining portions of the dielectric layer on sidewalls of the gate stacks 130 can serve as the gate spacers 140. In some embodiments, the gate spacers 140 may be used to offset subsequently formed doped regions, such as source/drain regions. The gate spacers 140 may further be used for designing or modifying the source/drain region profile.

Figure 6:
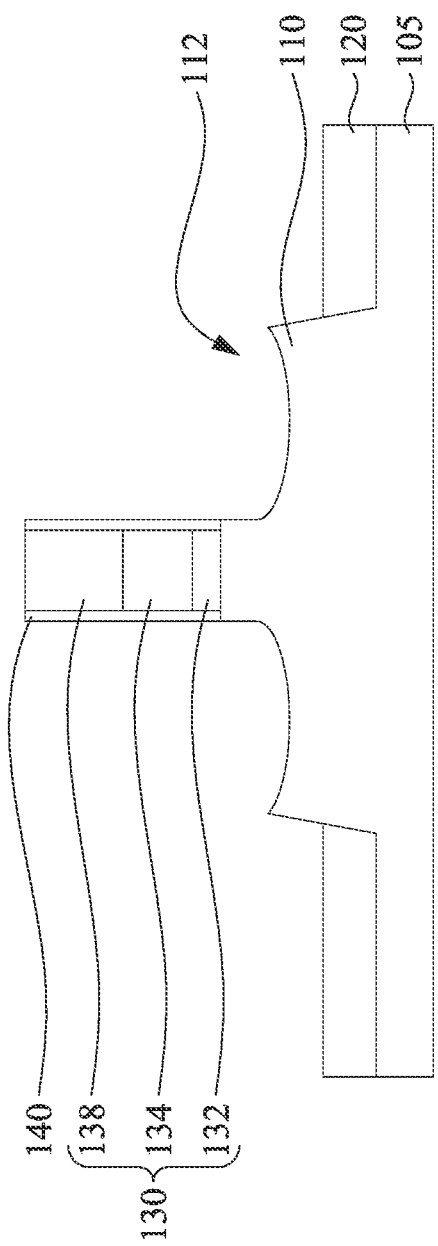

Referring back to FIG. 2A, the method M then proceeds to block S104 where a source/drain recess is formed into the semiconductor fin. With reference to FIG. 6, in some embodiments of block S104, portions of the semiconductor fin 110 not covered by the gate stacks 130 and the gate spacers 140 are recessed to form source/drain recesses 112. Formation of the source/drain recesses 112 may include a dry etching process, a wet etching process, or combination dry and wet etching processes. This etching process may include reactive ion etch (RIE) using the gate stacks 130 and gate spacers 140 as masks, or by any other suitable removal process. After the etching process, a pre-cleaning process may be performed to clean the recesses 112 with hydrofluoric acid (HF) or other suitable solution in some embodiments.

Figure 7:
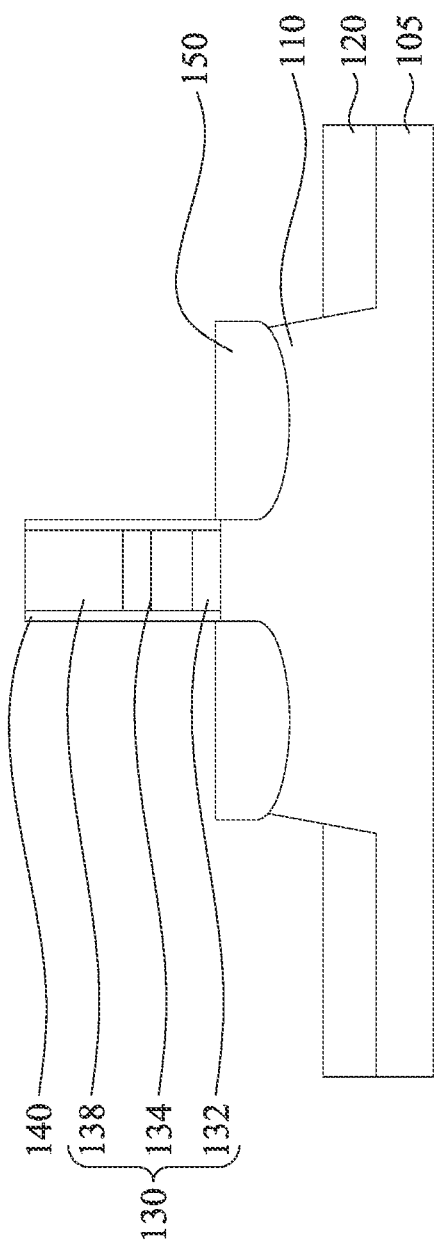

Referring back to FIG. 2A, the method M then proceeds to block S105 where a source/drain structure is formed into the source/drain recess. With reference to FIG. 7, in some embodiments of block S105, epitaxial source/drain structures 150 are respectively formed in the source/drain recesses 112 (see FIG. 6). The epitaxial source/drain structures 150 may be formed using one or more epitaxy or epitaxial (epi) processes, such that Si features, SiGe features, silicon phosphate (SiP) features, silicon carbide (SiC) features and/or other suitable features can be formed in a crystalline state on the semiconductor fins 110. In some embodiments, lattice constants of the epitaxial source/drain structures 150 are different from that of the semiconductor fin 110, so that the channel region between the epitaxial source/drain structures 150 can be strained or stressed by the epitaxial source/drain structures 150 to improve carrier mobility of the semiconductor device and enhance the device performance.

The epitaxy process includes CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 110 (e.g., silicon, silicon germanium, silicon phosphate, or the like). The epitaxial source/drain structures 150 may be in-situ doped. The doping species include p-type dopants, such as boron or $BF_2$; n-type dopants, such as phosphorus or arsenic; and/or other suitable dopants including combinations thereof. If the epitaxial source/drain structures 150 are not in-situ doped, an implantation process is performed to dope the epitaxial source/drain structures 150. One or more annealing processes may be performed to activate the epitaxial source/drain structures 150. The annealing processes include rapid thermal annealing (RTA) and/or laser annealing processes.

Figure 8:
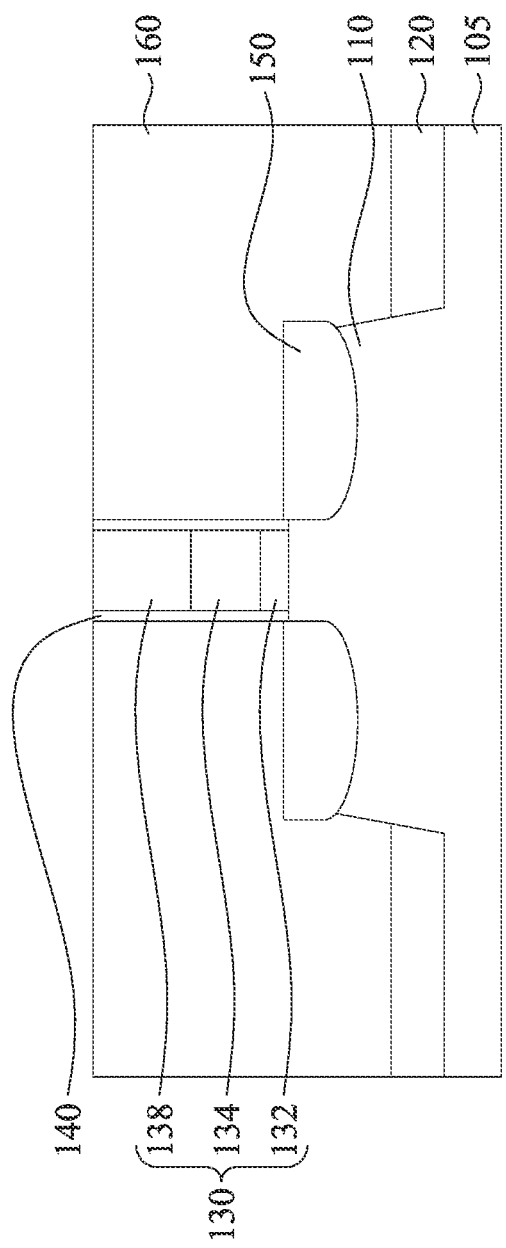

Referring back to FIG. 2A, the method M then proceeds to block S106 where a first interlayer dielectric (ILD) layer is deposited over the source/drain structure. With reference to FIG. 8, in some embodiments of block S106, an ILD layer 160 is deposited over the source/drain structures 150, the gate stacks 130, and the gate spacers 140, followed by performing a CMP process to remove excessive material of the ILD layer 160 to expose the gate stacks 130. The CMP process may planarize a top surface of the ILD layer 160 with a top surface of the gate stacks 130 and gate spacers 140. In some embodiments, the ILD layer 160 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 160 may be formed using, for example, CVD, ALD, spin-on-glass (SOG) or other suitable techniques.

Figure 9:
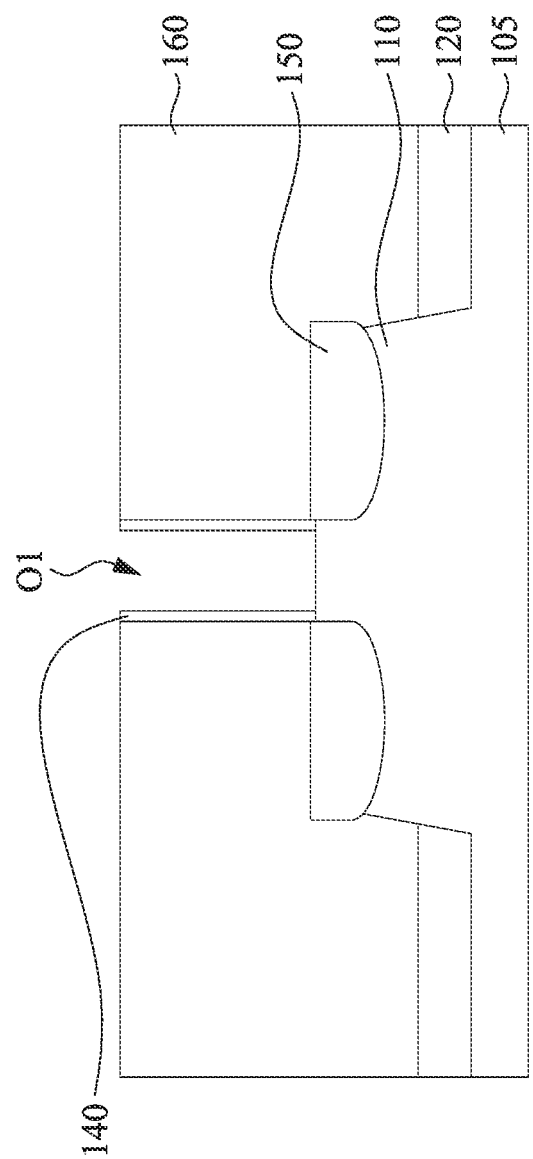

Referring back to FIG. 2A, the method M then proceeds to block S107 where at least a portion of the gate stack is removed to form a gate trench. With reference to FIG. 9, in some embodiments of block S107, at least portions of the gate stacks 130 (see FIG. 8) are removed to form gate trenches O1 with the gate spacers 140 as their sidewalls. In some embodiments, the gate dielectric 132, the dummy electrode 134, and the gate mask 138 are removed as shown in FIG. 9. In some embodiments, the dummy electrode 134 and the gate mask 138 are removed while the gate dielectric 132 are retained. The dummy gate stacks 130 may be removed by dry etching, wet etching, or a combination of dry and wet etching. For example, a wet etching process may include exposure to a hydroxide containing solution (e.g., ammonium hydroxide), deionized water, and/or other suitable etchant solutions.

Figure 10:
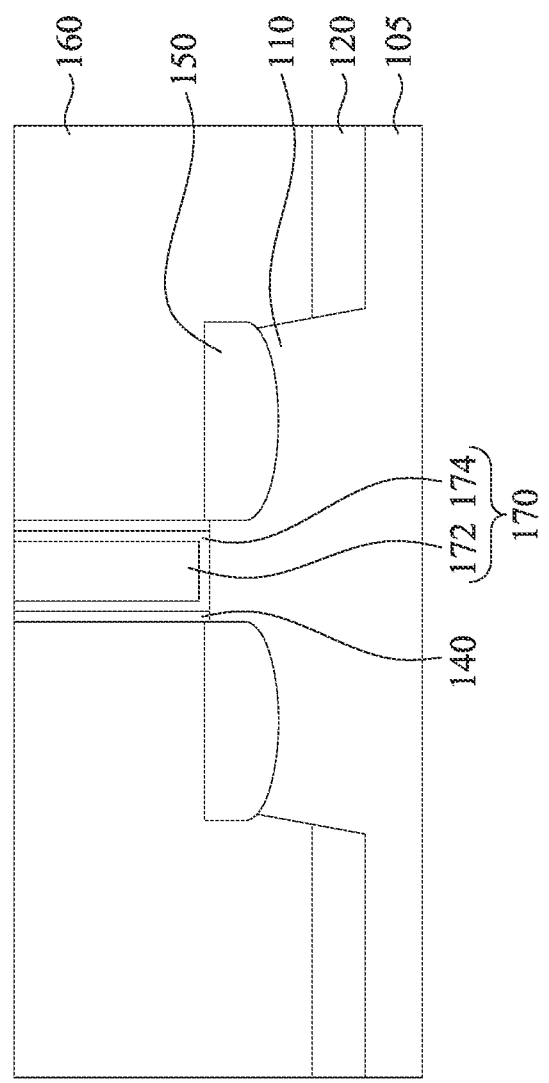

Referring back to FIG. 2A, the method M then proceeds to block S108 where a replacement gate structure is formed in the gate trench. With reference to FIG. 10, in some embodiments of block S108, replacement gate structures 170 are formed in the gate trenches O1 (as shown in FIG. 9). An exemplary method of forming the replacement gate structures 170 may include blanket forming a gate dielectric layer over the substrate 105, forming one or more work function metal layers over the blanket gate dielectric layer, forming a fill metal layer over the one or more work function metal layers, and performing a CMP process to remove excessive materials of the fill metal layer, the one or more work function metal layers and the gate dielectric layer outside the gate trenches O1. As a result of this method, each of the replacement gate structures 170 may include a metal gate electrode 172 and a gate dielectric layer 174 which wraps around the metal gate electrode 172. In some embodiments, the replacement gate structures 170 can be interchangeably referred to as a gate stack. In some embodiments, the replacement gate structures 170 can be interchangeably referred to as a gate strip.

In some embodiments, the gate dielectric layer 174 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric layer 174 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric layer 192 may have a multilayer structure such as one layer of silicon oxide (e.g., interfacial layer) and another layer of high-k material. In some embodiments, the gate dielectric layer 174 is made of the same material because the gate dielectric layer 174 is formed from the same dielectric layer blanket deposited over the substrate 105.

The metal gate electrode 172 includes suitable work function metals to provide suitable work functions. In some embodiments, the metal gate electrode 172 may include one or more n-type work function metals (N-metal) for forming an n-type transistor on the substrate 105. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the metal gate electrode 172 may include one or more p-type work function metals (P-metal) for forming a p-type transistor on the substrate 105. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. At least two of the work function metals in the metal gate electrode 172 may be made of different work function metals so as to achieve suitable work functions in some embodiments. In some embodiments, an entirety of the metal gate electrode 172 is a work function metal of a same material.

Figure 11:
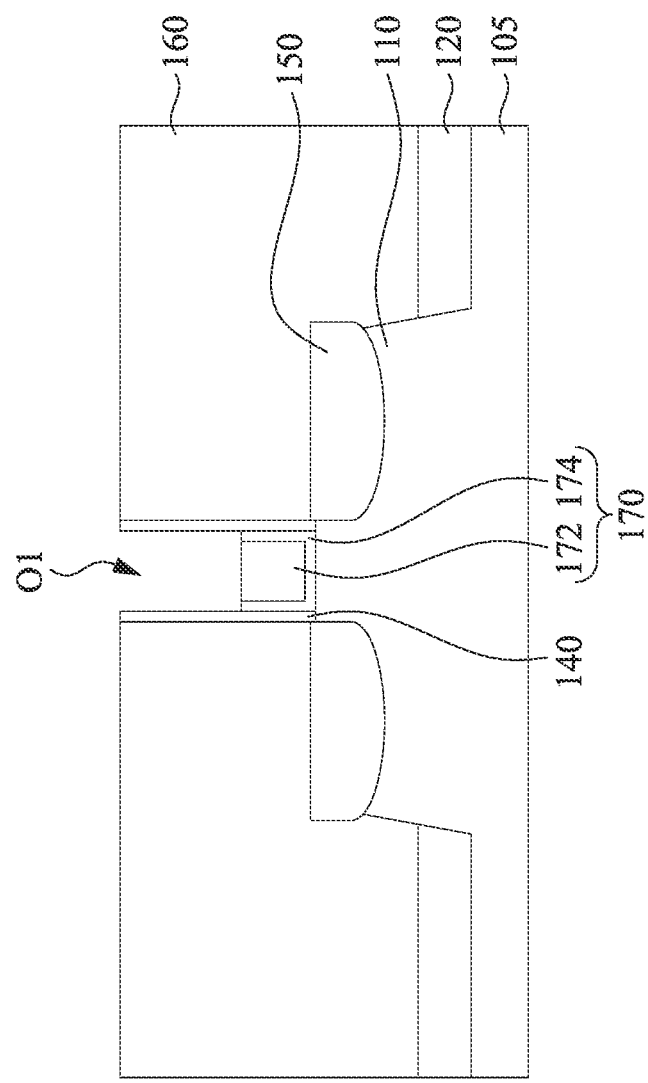

Referring back to FIG. 2A, the method M then proceeds to block S109 where an etch back process is performed on the replacement gate structure to scale down the replacement gate structure. With reference to FIG. 11, in some embodiments of block S109, a metal gate etch back (MGEB) process is performed on the replacement gate structures 170 to scale down the replacement gate structures 170. The MGEB process may include a bias plasma etching step. The bias plasma etching step may be performed to remove portions of the replacement gate structures 170 to thin down the replacement gate structures 170. Portions of the gate trenches O1 may reappear with shallower depth. Top surfaces of the replacement gate structures 170 may be no longer level with the ILD layer 160. Sidewalls of the gate spacers 140 are then exposed from the replacement gate structures 170. In some embodiments, the bias plasma etching step may use a gas mixture of $Cl_2$, $O_2$, $BCl_3$, and Ar with a bias in a range from about 25V to about 1200V.

Figure 12:
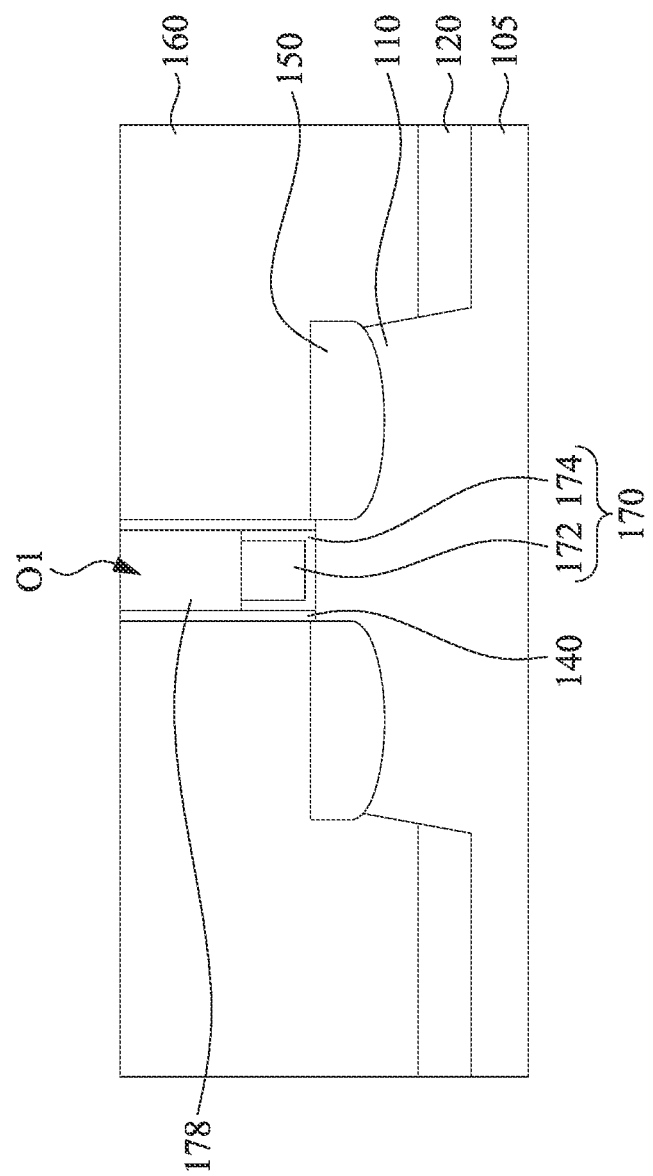

Referring back to FIG. 2A, the method M then proceeds to block S110 where a first protective cap is formed over the replacement gate structure. With reference to FIG. 12, in some embodiments of block S110, a protective cap 178 is formed over the replacement gate structures 170 using, for example, a deposition process to deposit a dielectric material over the substrate 105, followed by a CMP process to remove excess dielectric material outside the gate trench O1. In some embodiments, the protective cap 178 may include $SiN_x$, $SiO_x$, SiON, SiC, SiBN, SiCBN, other suitable dielectric materials, or combinations thereof. The protective cap 178 has different etch selectivity than the spacers 140 and/or the ILD layer 160, so as to selective etch back the protective cap 178. By way of example, if the protective cap 178 is made of silicon nitride, the spacers 140 and/or the ILD layer 160 may be made of a dielectric material different from silicon nitride. If the protective cap 178 is made of silicon carbide (SiC), the spacers 140 and/or the ILD layer 160 may be made of a dielectric material different from silicon carbide. Therefore, the protective cap 178 can be used to define self-aligned gate contact region and thus referred to as a self-aligned contact (SAC) structure or a SAC layer.

Figure 13:
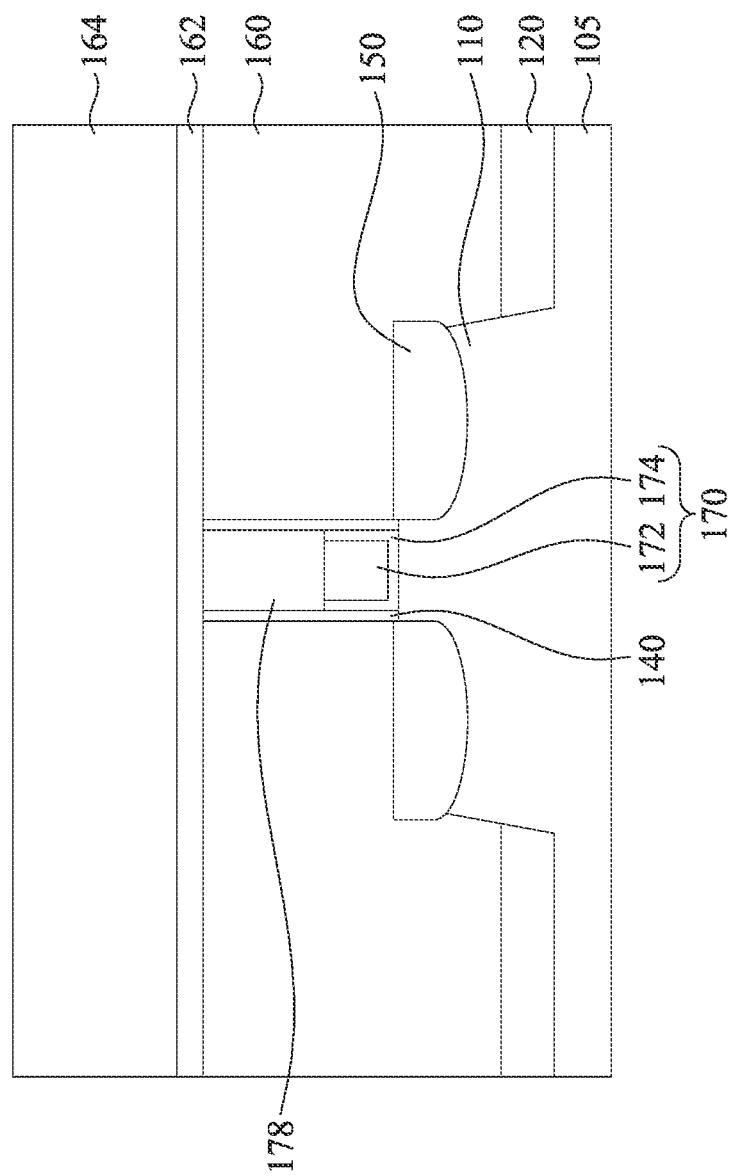

Referring back to FIG. 2B, the method M then proceeds to block S111 where a contact etch stop layer (CESL) and a second ILD layer are deposited over the substrate. With reference to FIG. 13, in some embodiments of block S111, a CESL 162 is deposited over the gate spacers 140, the ILD layer 160, and the protective cap 178. Subsequently, an ILD layer 164 is deposited over the CESL 162. In some embodiments, the CESL 162 may include $SiN_x$, $SiO_x$, SiON, SiC, SiBN, SiCBN, other suitable dielectric materials, or combinations thereof. In some embodiments, the CESL 162 may be made of a different material than the protective cap 178, the gate spacers 140, and/or the ILD layer 160. By way of example, if the CESL 162 is made of silicon nitride, the gate spacers 140 and/or the ILD layer 160 is made of a dielectric material different from silicon nitride. In some embodiments, the CESL 162 can be formed using, for example, plasma enhanced CVD, low pressure CVD, ALD or other suitable techniques. In some embodiments, the ILD layer 164 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the ILD layer 164 may be formed using, for example, CVD, ALD, spin-on-glass (SOG) or other suitable techniques.

Figure 14:
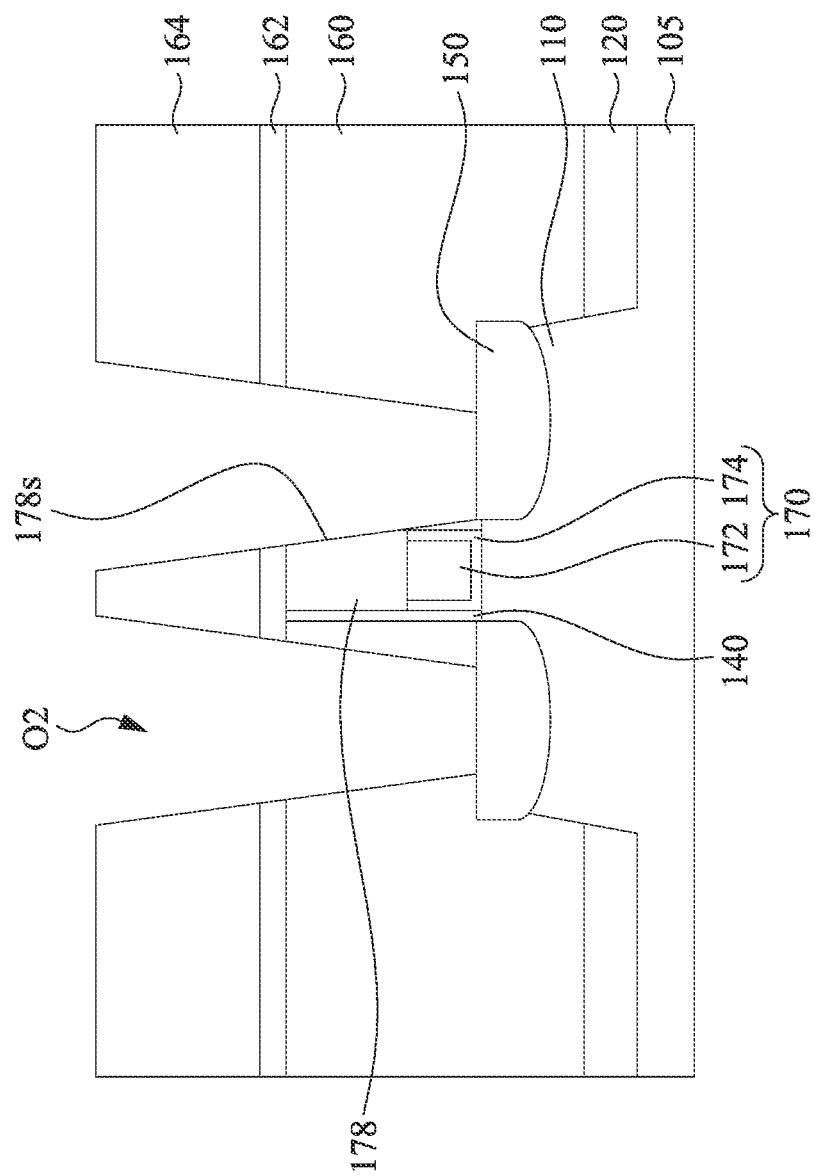
Figure 15:
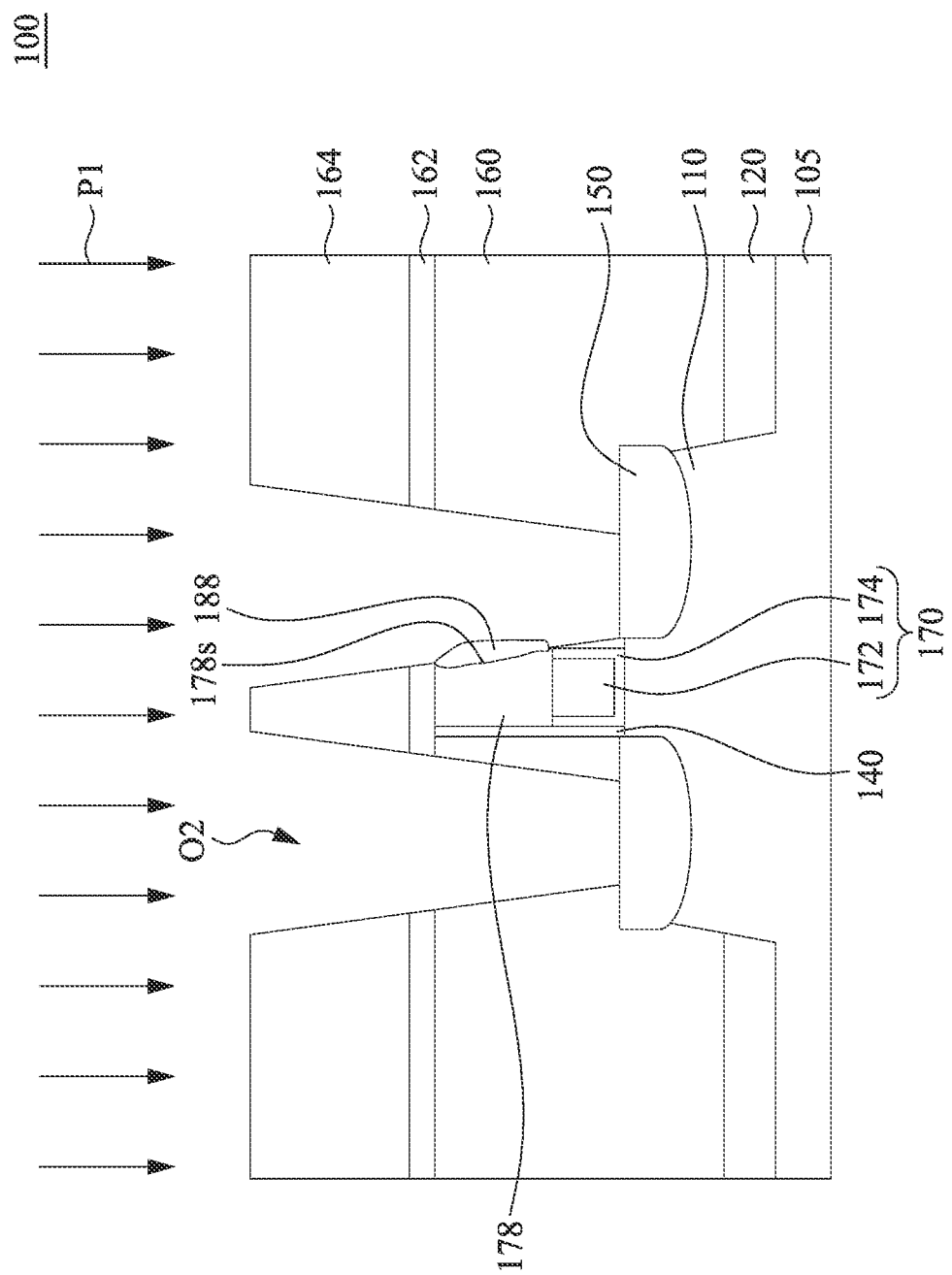
Figure 17:
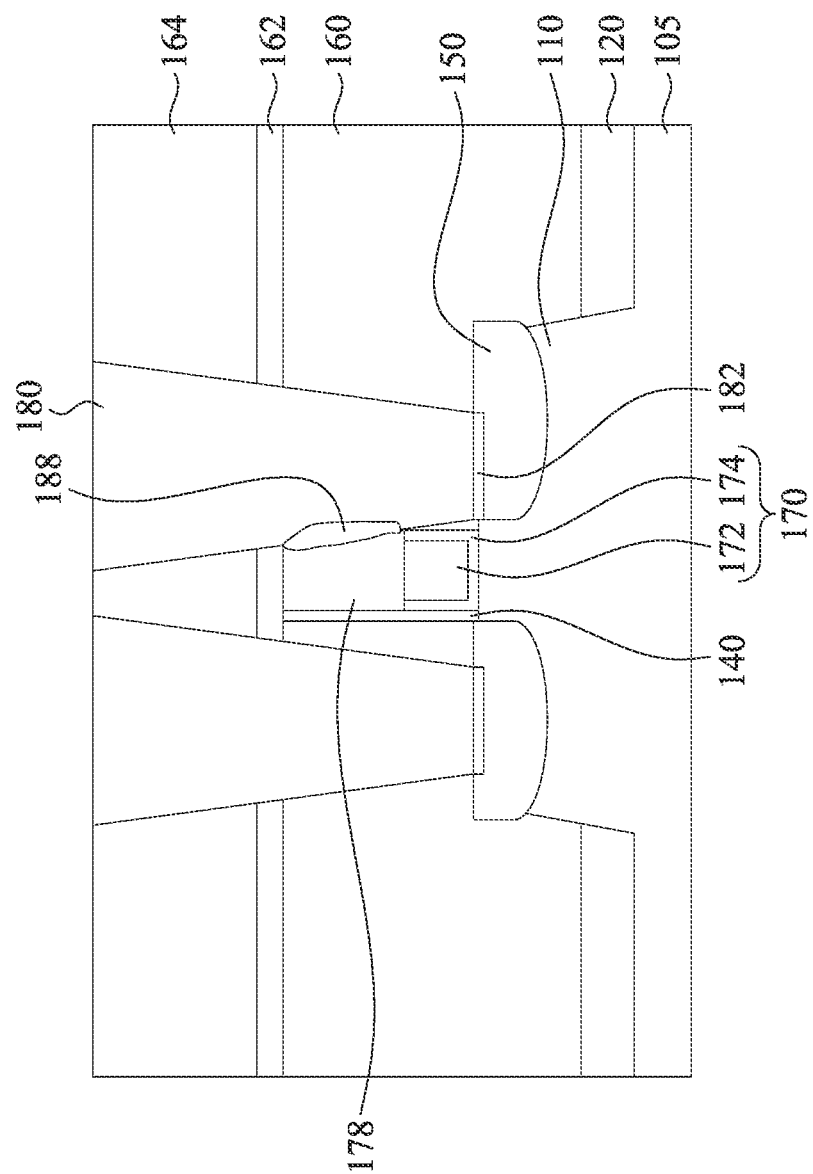

Referring back to FIG. 2B, the method M then proceeds to block S112 where a source/drain contact opening is formed through the first and second ILD layers and the CESL to expose the epitaxial source/drain structure. With reference to FIG. 14, in some embodiments of block S112, one or more etching process may be performed to sequentially etch through the ILD layer 164, the CESL 162, and ILD layer 160 down to the epitaxial source/drain structures 150 to form source/drain contact openings O2 where a source/drain contact 180 will be subsequently formed therein as shown in FIG. 17. In some embodiments, the etching process would consume at least one of the spacer layer 140 and/or the protective cap 178, and thus the at least one of the gate spacers 140 and/or the protective cap 178 may be damaged as shown in FIG. 14. The etching process etches a tip corner of the protective cap 178 to form an inclined surface 178s. The protective cap 178 exposed in the source/drain contact opening O2 has a thinner thickness than under the CESL 162 and the ILD layer 164. The gate spacer 140 exposed in the source/drain contact opening O2 may have a less vertical dimension than under the CESL 162 and the ILD layer 164. If the source/drain contact 180 (see FIG. 17) formed subsequently in the source/drain contact opening O2 directly lands on the thinned protective cap 178, a leakage current may occur to flow between the source/drain contact 180 and the replacement gate structure 170 through the thinned protective cap 178, which in turn reduces the yield of the semiconductor device 100. Therefore, an additional cap material 188 as shown in FIG. 15 may be formed over the protective cap 178 in the source/drain contact opening O2 to increase a distance between the source/drain contact 180 (see FIG. 17) and the replacement gate structure 170, which in turn prevents a leakage current from flowing between the source/drain contact 180 and the replacement gate structure 170, and thus the yield of the semiconductor device 100 can be improved. In some embodiments, the cap material 188 can be interchangeably referred to as a leakage barrier.

This is described in greater detail with reference to FIG. 14, a patterned mask layer (not shown) may be formed over the substrate 105. In some embodiments, the mask layer is formed by spin coating a resist material (e.g., the mask layer may be also referred to as a photo resist layer), followed by a process, such as a soft baking process and a hard baking process (may be also referred to as a pre-exposure baking). In some embodiments, the mask layer is a DUV resist such as a krypton fluoride (KrF) resist or an argon fluoride (ArF) resist. In some embodiments, the mask layer is an I-line resist, a EUV resist, an electron beam (e-beam) resist, or an ion beam resist. In some embodiments, the mask layer is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the mask layer is a negative resist. The negative resist is soluble in a developer but becomes insoluble upon radiation. After coating the mask layer over the substrate 105, the mask layer is exposed to a radiation through a mask. After exposing the mask layer to the radiation is complete, the exposed mask layer undergoes one or more post-exposure baking (PEB) processes. Subsequently, a developing process is performed, such that portions of the exposed mask layer are removed, and the mask layer acts as a mask to protect the replacement gate structure 170 from a subsequent etching process. When the etching process is complete, the source/drain contact openings O2 are formed to run through the ILD layer 164, the CESL 162, and the ILD layer 160 and to expose the epitaxial source/drain structures 150.

In some embodiments, the etching process etches the ILD layers 160 and 164 and the CESL 162 at a faster etch rate than it etches the gate spacer 140 and the protective cap 178. By way of example and not limitation, a ratio of the etch rate of the ILD layer 164, the CESL 162, and/or ILD layer 160 to the etch rate of the gate spacer 140 and/or the protective cap 178 may be greater than about 2. If the ratio of the etch rate of the ILD layer 164, the CESL 162, and/or ILD layer 160 to the etch rate of the gate spacer 140 and/or the protective cap 178 is less than about 2, the etching process would significantly consume the gate spacer 140 and/or the protective cap 178 to expose the replacement gate structure 170, which in turn increases a risk that a deteriorated leakage current could flow between the replacement gate structure 170 and a source/drain contact 180 formed subsequently in the source/drain contact opening O2. In some embodiments, a ratio of the etch rate of the ILD layer 164, the CESL 162, and/or ILD layer 160 to the etch rate of the gate spacer 140 and/or the protective cap 178 may be greater than about 10.

In some embodiments, the etching process is an anisotropic dry etching process (e.g., a reactive-ion etching (RIE) process or an atomic layer etching (ALE) process). By way of example and not limitation, a dry etching process may implement an oxygen-containing gas, a fluorine-containing gas (e.g., $CF_4$, $SF_6$, $CH_2F_2$, $CHF_3$, and/or $C_4F_8$), a chlorine-containing gas (e.g., $Cl_2$ and/or $BCl_3$), a bromine-containing gas (e.g., HBr), an iodine-containing gas, other suitable gases and/or plasmas, and/or combinations thereof.

Referring back to FIG. 2B, the method M then proceeds to block S113 where a cap material is selectively deposited on the protective cap exposed in the source/drain contact opening. With reference to FIG. 15, in some embodiments of block S113, a cap material 188 may be selectively deposited on the protective cap 178 exposed in the source/drain contact opening O2. Therefore, the cap material 188 on a exposed surface 178s of the protective cap 178 is formed to increase a distance between the replacement gate structure 170 and a source/drain contact 180 (see FIG. 17) formed subsequently in the source/drain contact opening O2, which in turn prevents a leakage current from flowing between the replacement gate structure 170 and the source/drain contact 180. In particular, the selective deposition process P1 may be performed to selectively deposit the protective cap 178 rather than on the surrounding structures (e.g. the ILD layers 160 and 164, CESL 162, and the gate spacer 140). In some embodiments, the dielectric material included in the cap material 188 and deposited by the selective deposition process P1 may be a III-V compound material, such as a boron containing material. By way of example but not limitation, the boron containing material may include boron, boron nitride, boron carbide, other suitable materials, and/or combinations thereof. In some embodiments, the dielectric material included in the cap material 188 and deposited by the selective deposition process P1 may be silicon oxide. In some embodiments, the dielectric material included in the cap material 188 and deposited by the selective deposition process P1 may be fluorocarbon. As shown in FIG. 15, the cap material 188 is spaced apart from the replacement gate structures 170 by the protective cap 178. In some embodiments, the cap material 188 has a less lateral dimension than the protective cap 178. By way of example but not limitation, the capping material 188 on the protective cap 178 may have a thickness in a range from about 0.5 nm to about 15 nm, such as 0.5, 1, 2, 3, 4, 5, 6, 7, 8, 9, 10, 11, 12, 13, 14, or 15 nm.

This is described in greater detail with reference to FIG. 15, the cap material 188 may be formed by the selective deposition process P1 that exhibits a higher deposition rate on first dielectric surfaces (e.g. a surface of the protective cap 178) than on second dielectric surfaces (e.g. surfaces of the ILD layers 160 and 164, CESL 162, and the gate spacer 140). Therefore, the cap material 188 may be made a different material than surrounding structures (e.g. the ILD layers 160 and 164, CESL 162, and the gate spacer 140). By way of example but not limitation, if the protective cap 178 is made of silicon nitride (SiN), the ILD layers 160 and 164, CESL 162, and the gate spacer 140 may be made of materials different than the silicon nitride. If the protective cap 178 is made of silicon carbide (SiC), the ILD layers 160 and 164, CESL 162, and the gate spacer 140 may be made of materials different than the silicon carbide. In some embodiments, the selective deposition process P1 may be performed by an inductively coupled plasma (ICP) tool or a capactitively coupled plasma (CCP) tool. In some embodiments, the deposition gas used in the selective deposition process P1 may include a mixture of $BCl_3$ and $N_2$ in plasma state to deposit boron or boron nitride; a mixture of $BCl_3$, $CH_4$ and $H_2$ in plasma state to deposit boron carbide. For example, the selective deposition process P1 using the boron-containing precursors may exhibit a higher deposition rate on the material of protective cap 178 (e.g., silicon nitride) than on other materials (e.g., oxide material of ILD layers 160 and 164), which in turns deposits a thicker dielectric material on the protective cap 178 than on other surfaces. In some embodiments, the selective deposition process P1 using the boron-containing precursors may deposit the dielectric material (e.g., the protective cap 178) on the protective cap 178, but not on other surfaces. In some embodiments, the cap material 188 may be formed in-situ or ex-situ with the etching process of forming the source/drain contact opening O2.

Figure 16:
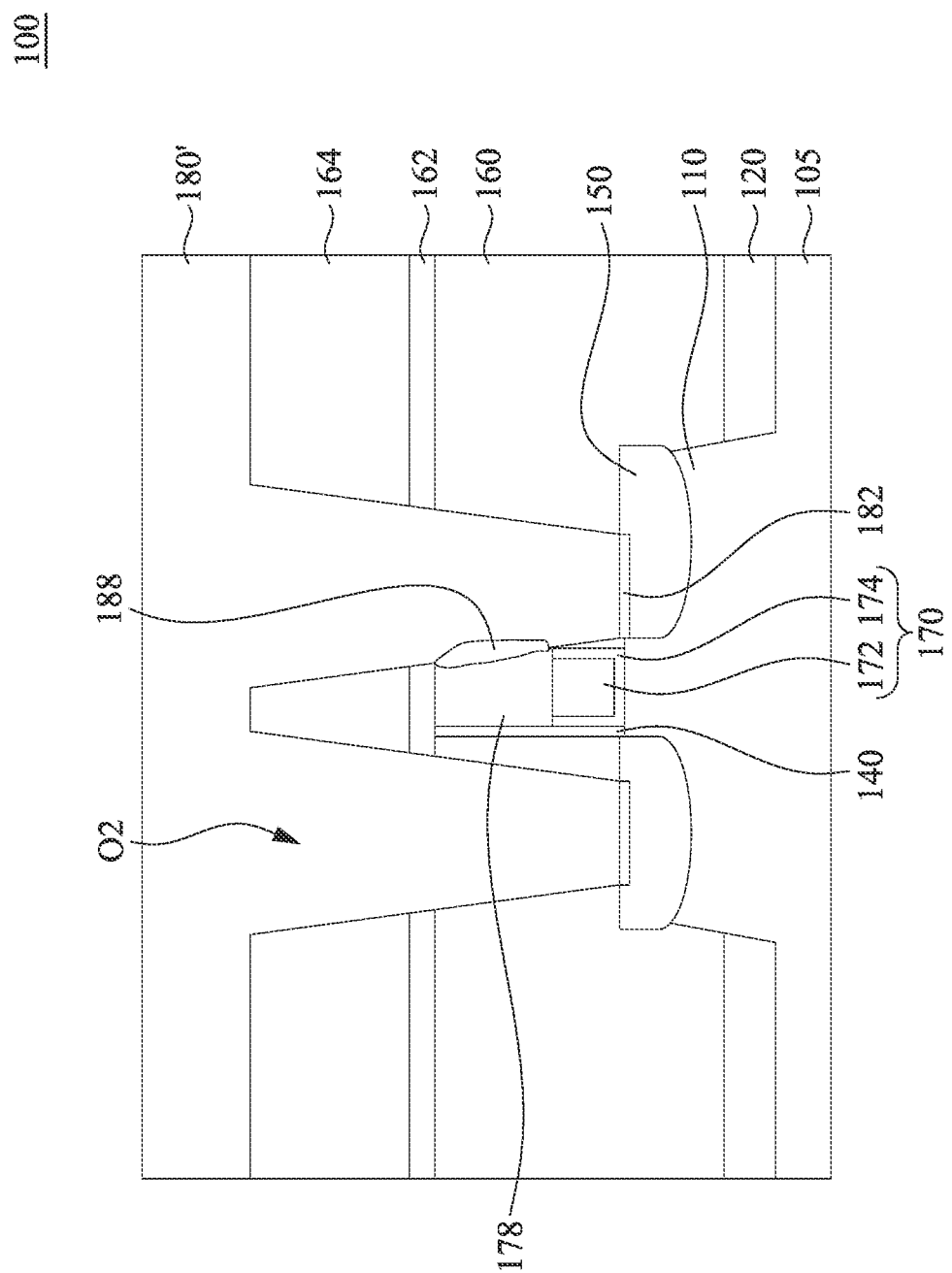

Referring back to FIG. 2B, the method M then proceeds to block S114 where a conductive material is deposited over the substrate to fill in the source/drain contact opening. With reference to FIG. 16, in some embodiments of block S114, a conductive material 180' is deposited over the substrate 105 and fills in the source/drain contact openings O2. The conductive material 180' includes, for example, cobalt, tungsten, ruthenium or other suitable metals. In some embodiments, the method of forming the conductive material 180' may include CVD, PVD, ALD, or other suitable processes. In some embodiments, before the conductive material 180' is formed, a silicide layer 182 may be formed on the epitaxial source/drain structure 150 by a metal silicidation process. The metal silicidation process is to make a reaction between metal and silicon (or polycrystalline silicon). Regarding the metal silicidation process, a first rapid thermal annealing (RTA) process may be performed in, for example, Ar, He, $N_2$ or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Then, a second annealing or RTA step at a second temperature higher than the first temperature, such as 400~500° C., thereby forming a stable silicide layer 182 with low resistance. In some embodiments, the silicide layer 182 may include titanium silicide (TiSi), nickel silicide (NiSi), cobalt silicide (CoSi), Ni—Pt, or combinations thereof.

Referring back to FIG. 2B, the method M then proceeds to block S115 where a chemical mechanical polishing process is performed on the conductive material to remove the excess portions of the conductive material to form a source/drain contact in the source/drain contact opening and landing on the source/drain structure. With reference to FIG. 17, in some embodiments of block S115, the excess portions of the conductive material 180' (see FIG. 16) are removed, either through etching, chemical mechanical polishing (CMP), or the like, forming the upper surface of the metal-filled opening substantially coplanar with a top surface of the ILD layer 164. The remaining portions of the conductive material 180' (see FIG. 16) in the source/drain contact opening O2 forms the source/drain contact 180. In some embodiments, the source/drain contact 180 can be interchangeably referred to as a metal-like defined (MD) layer. As shown in FIG. 17, the cap material 188 is sandwiched between the source/drain contact 180 and the protective cap 178. Therefore, the cap material 188 is formed to increase a distance between the source/drain contact 180 and the replacement gate structures 170, which in turn prevents a leakage current from flowing between the source/drain contact 280 and the replacement gate structures 170, and thus the yield of the semiconductor device 100 can be improved. In some embodiments, the cap material 188 is embedded in the source/drain contact 180 has a side surface coterminous with a sidewall of the source/drain contact 180.

In some embodiments, the method may further include forming a gate contact landing on the replacement gate structures 170. Subsequently, a butted contact may be formed to connect a gate and a source/drain contact of another transistor over the substrate 105. Subsequently, an interconnect structure may be formed over the substrate 105. The interconnect structure may include a plurality of metallization layers with multiple metallization vias or interconnects. Subsequently, a passivation layer may be deposited over the interconnect structure to form an integrated structure.

In order to define self-aligned gate contact region over a gate structure, a protective cap may be formed on the gate structure. However, the etching process for forming a source/drain contact opening in a subsequent process may consume the protective cap, and thus the protective cap may be damaged to a thinner thickness, and thus may not be thick enough to suppress a leakage current. That is, if the source/drain contact formed subsequently in the opening directly lands on the thinner protective cap, a leakage current may occur to flow between the source/drain contact and the gate structure through the thinner protective cap, which in turn reduces the yield of the semiconductor device.

Based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a selective deposition process for forming a cap material over the thinned protective cap that is exposed in the source/drain contact opening. An advantage is that the cap material on the thinned protective cap may be formed to increase a distance between the gate structure and the source/drain contact formed in the source/drain contact opening, which in turn prevents a leakage current from flowing between the gate structure and the source/drain contact, and thus the yield of the semiconductor device can be improved.

In some embodiments, the method forming a semiconductor device incudes forming gate spacers on a substrate; forming a gate structure on the substrate and laterally between the gate spacers; forming a protective cap over the gate structure and laterally between the gate spacers; forming source/drain structures over the substrate and on opposite sides of the gate structure; depositing a dielectric layer over the protective cap, the gate spacers, and the source/drain structures; performing an etching process on the dielectric layer to form an opening exposing one of the source/drain structures, the etching process further etching a first one of the gate spacers to expose the protective cap; selectively depositing a capping material on the exposed protective cap; forming a source/drain contact in the opening. In some embodiments, selectively depositing the capping material is performed by using a plasma process. In some embodiments, selectively depositing the capping material is performed using a boron-containing gas. In some embodiments, the boron-containing gas is boron trichloride gas. In some embodiments, the capping material is made of at least one of boron, boron nitride, or boron carbide. In some embodiments, the capping material is made of fluorocarbon. In some embodiments, the capping material is selectively deposited using a deposition process that deposits the capping material on the protective cap at a faster deposition rate than on the dielectric layer. In some embodiments, the capping material is made of silicon nitride, and the dielectric layer is made of silicon oxide. In some embodiments, the etching process further etches the protective cap to form an inclined surface, and the capping material is selectively deposited on the inclined surface of the protective cap. In some embodiments, after performing the etching process, the first one of the gate spacers has a shorter vertical dimension than a second one of the gate spacers.

In some embodiments, the method forming a semiconductor device incudes forming a semiconductor fin extending upwardly from a substrate; forming a gate stack extending across the semiconductor fin; forming a protective cap atop the gate stack; forming epitaxial structures in the semiconductor fin and on opposite sides of the gate stack; depositing a dielectric layer over the protective cap and the epitaxial structures; performing an etching process on the dielectric layer to form an source/drain contact opening exposing the protective cap, the etching process etching the protective cap to form an inclined surface on the protective cap; forming a leakage barrier on the inclined surface of the protective cap; forming a source/drain contact in the source/drain contact opening and over the leakage barrier. In some embodiments, the leakage barrier is formed using a selective deposition process. In some embodiments, the selective deposition process includes an inductively coupled plasma (ICP) process or a capacitively coupled plasma (CCP) process. In some embodiments, the leakage barrier is formed in-situ with the etching process of forming the source/drain contact opening. In some embodiments, the leakage barrier is formed ex-situ with the etching process of forming the source/drain contact opening.

In some embodiments, the semiconductor device includes a substrate, a fin, a gate strip, first and second gate spacers, source/drain regions, a source/drain contact, a protective cap, and a leakage barrier. The fin is on a substrate. The gate strip extends across the fin. The protective cap is over the gate strip. The source/drain regions are in the fin and on opposite sides of the gate strip. The first gate spacer is between the gate strip and a first one of the source/drain regions. The second gate spacer is between the gate strip and a second one of the source/drain regions, the second gate spacer having a top end higher than a top end of the first gate spacer. The source/drain contact is on the first one of the source/drain regions. The leakage barrier is on a sidewall of the protective cap and overlapping the top end of the first gate spacer. In some embodiments, the leakage barrier is made of a boron-based material. In some embodiments, the leakage barrier is spaced apart from the gate strip by the protective cap. In some embodiments, a bottommost position of the leakage barrier is higher than a top surface of the gate strip. In some embodiments, the leakage barrier and the protective cap forms an interface slanted with respect to the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming a semiconductor device, comprising:
 forming gate spacers on a substrate;
 forming a gate structure on the substrate and laterally between the gate spacers;
 forming a protective cap over the gate structure and laterally between the gate spacers;

forming source/drain structures over the substrate and on opposite sides of the gate structure;
depositing a dielectric layer over the protective cap, the gate spacers, and the source/drain structures;
performing an etching process on the dielectric layer to form an opening exposing one of the source/drain structures, the etching process further etching a first one of the gate spacers to expose the protective cap;
selectively depositing a capping material on the exposed protective cap, wherein the capping material is selectively deposited using a deposition process that deposits the capping material on the protective cap at a faster deposition rate than on the dielectric layer; and
forming a source/drain contact in the opening.

2. The method of claim 1, wherein selectively depositing the capping material is performed by using a plasma process.

3. The method of claim 1, wherein selectively depositing the capping material is performed using a boron-containing gas.

4. The method of claim 3, wherein the boron-containing gas is boron trichloride gas.

5. The method of claim 1, wherein the capping material is made of at least one of boron, boron nitride, or boron carbide.

6. The method of claim 1, wherein the capping material is made of fluorocarbon.

7. The method of claim 1, wherein the deposition process comprises an inductively coupled plasma process or a capacitively coupled plasma process.

8. The method of claim 1, wherein the capping material is made of silicon nitride, and the dielectric layer is made of silicon oxide.

9. The method of claim 1, wherein the etching process further etches the protective cap to form an inclined surface, and the capping material is selectively deposited on the inclined surface of the protective cap.

10. The method of claim 1, wherein after performing the etching process, the first one of the gate spacers has a shorter vertical dimension than a second one of the gate spacers.

11. A method for forming a semiconductor device, comprising:
forming a semiconductor fin extending upwardly from a substrate;
forming a gate stack extending across the semiconductor fin;
forming a protective cap atop the gate stack;
forming epitaxial structures in the semiconductor fin and on opposite sides of the gate stack;
depositing a dielectric layer over the protective cap and the epitaxial structures;
performing an etching process on the dielectric layer to form an source/drain contact opening exposing the protective cap, the etching process etching the protective cap to form an inclined surface on the protective cap;
forming a leakage barrier on the inclined surface of the protective cap; and
forming a source/drain contact in the source/drain contact opening and over the leakage barrier.

12. The method of claim 11, wherein the leakage barrier is formed using a selective deposition process.

13. The method of claim 12, wherein the selective deposition process includes an inductively coupled plasma (ICP) process or a capacitively coupled plasma (CCP) process.

14. The method of claim 11, wherein the leakage barrier is formed in-situ with the etching process of forming the source/drain contact opening.

15. The method of claim 11, wherein the leakage barrier is formed ex-situ with the etching process of forming the source/drain contact opening.

16. A semiconductor device, comprising:
a fin on a substrate;
a gate strip extending across the fin;
a protective cap over the gate strip;
source/drain regions in the fin and on opposite sides of the gate strip;
a first gate spacer between the gate strip and a first one of the source/drain regions;
a second gate spacer between the gate strip and a second one of the source/drain regions, the second gate spacer having a top end higher than a top end of the first gate spacer;
a source/drain contact on the first one of the source/drain regions; and
a leakage barrier on a sidewall of the protective cap and overlapping the top end of the first gate spacer.

17. The semiconductor device of claim 16, wherein the leakage barrier is made of a boron-based material.

18. The semiconductor device of claim 16, wherein the leakage barrier is spaced apart from the gate strip by the protective cap.

19. The semiconductor device of claim 16, wherein a bottommost position of the leakage barrier is higher than a top surface of the gate strip.

20. The semiconductor device of claim 16, wherein the leakage barrier and the protective cap form an interface slanted with respect to the substrate.

* * * * *